United States Patent
Hirobe

(10) Patent No.: US 12,407,308 B2
(45) Date of Patent: Sep. 2, 2025

(54) RADIO-FREQUENCY CIRCUIT AND COMMUNICATION DEVICE

(71) Applicant: Murata Manufacturing Co., Ltd., Kyoto (JP)

(72) Inventor: Masakazu Hirobe, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 492 days.

(21) Appl. No.: 18/054,933

(22) Filed: Nov. 14, 2022

(65) Prior Publication Data

US 2023/0073635 A1    Mar. 9, 2023

Related U.S. Application Data

(63) Continuation of application No. PCT/JP2021/016502, filed on Apr. 23, 2021.

(30) Foreign Application Priority Data

Jun. 19, 2020  (JP) ................. 2020-106479

(51) Int. Cl.
 *H03F 3/191*  (2006.01)
 *H03F 3/24*   (2006.01)

(52) U.S. Cl.
 CPC ......... *H03F 3/245* (2013.01); *H03F 2200/24* (2013.01); *H03F 2200/451* (2013.01); *H03F 2200/78* (2013.01)

(58) Field of Classification Search
 CPC .................................. H03F 3/191; H03F 1/30
 USPC ....................................... 330/302, 296, 297
 See application file for complete search history.

(56) References Cited

U.S. PATENT DOCUMENTS

| | | |
|---|---|---|
| 5,805,986 A | 9/1998 | Mizusawa et al. |
| 2005/0270105 A1 | 12/2005 | Van Bezooijen et al. |
| 2006/0267688 A1 | 11/2006 | Tanque et al. |
| 2012/0154047 A1 | 6/2012 | Nakahashi et al. |
| 2018/0262165 A1 | 9/2018 | Ishihara et al. |

(Continued)

FOREIGN PATENT DOCUMENTS

| | | |
|---|---|---|
| JP | H06-260958 A | 9/1994 |
| JP | H09-8578 A | 1/1997 |

(Continued)

OTHER PUBLICATIONS

International Search Report for PCT/JP2021/016502 dated Jun. 29, 2021.

*Primary Examiner* — Henry Choe
(74) *Attorney, Agent, or Firm* — McDonald Hopkins LLC

(57) ABSTRACT

A radio-frequency circuit includes an amplifier circuit, a bias circuit, a bias control circuit, a comparing section, a signal input terminal, an antenna terminal, an attenuation circuit, and a control unit. The amplifier circuit includes a specific transistor. The bias circuit supplies a bias current or a bias voltage to the input terminal of the specific transistor. The bias control circuit supplies a control current or a control voltage to the bias circuit. The comparing section compares a threshold voltage with a power supply voltage of a power supply terminal connected to the output terminal of the specific transistor. The attenuation circuit is connected in a signal path between the signal input terminal and the antenna terminal and is capable of attenuating the radio-frequency signal. The control unit changes an attenuation of the attenuation circuit in accordance with a compared result of the comparing section.

13 Claims, 7 Drawing Sheets

(56) References Cited

U.S. PATENT DOCUMENTS

| | | |
|---|---|---|
| 2019/0190455 A1 | 6/2019 | Kondo et al. |
| 2020/0136559 A1 | 4/2020 | Shimamoto |
| 2020/0169235 A1 | 5/2020 | Valk |

FOREIGN PATENT DOCUMENTS

| | | |
|---|---|---|
| JP | H11-168395 A | 6/1999 |
| JP | 2005-539448 A | 12/2005 |
| JP | 2006-319508 A | 11/2006 |
| JP | 2008-113223 A | 5/2008 |
| JP | 2012-134612 A | 7/2012 |
| JP | 2012-151539 A | 8/2012 |
| JP | 2018-152714 A | 9/2018 |
| JP | 2019-110505 A | 7/2019 |
| JP | 2020-072468 A | 5/2020 |

US 12,407,308 B2

RADIO-FREQUENCY CIRCUIT AND COMMUNICATION DEVICE

CROSS REFERENCE TO RELATED APPLICATION

This is a continuation of International Application No. PCT/JP2021/016502 filed on Apr. 23, 2021 which claims priority from Japanese Patent Application No. 2020-106479 filed on Jun. 19, 2020. The contents of these applications are incorporated herein by reference in their entireties.

BACKGROUND ART

Technical Field

The present disclosure generally relates to a radio-frequency circuit and a communication device and, more specifically, to a radio-frequency circuit including an amplifier circuit, and a communication device.

Hitherto, a power amplifier module that includes a power amplifier circuit and a bias circuit is known (see, for example, Patent Document 1).

The amplifier circuit includes a plurality of amplifiers connected in multiple stages. Each of the amplifiers includes a common-emitter transistor. The collector of the transistor is connected to a power supply voltage through an inductance element.

The bias circuit includes a plurality of emitter follower transistors and a control IC. The control IC includes a first current source and a second current source. The first current source supplies the collector of each of the plurality of emitter follower transistors with a control current that changes following a change in control voltage. The first current source limits the control current to less than or equal to an upper limit. The second current source supplies the base of each of the plurality of emitter follower transistors with a constant current.

Patent Document 1: Japanese Unexamined Patent Application Publication No. 2018-152714

BRIEF SUMMARY

In the power amplifier module described in Patent Document 1, when the power supply voltage is higher than a rated power supply voltage, there have been variations in bias current or bias voltage supplied to the base of, for example, the transistor of the amplifier because of the influence of variations in $h_{fe}$ (output short-circuit current gain) of the emitter follower 30. Therefore, with the power amplifier module described in Patent Document 1, the characteristics of at least one of the amplifier circuit and an electronic component to which a radio-frequency signal amplified by the amplifier circuit is input sometimes degrade.

The present disclosure provides a radio-frequency circuit and a communication device capable of further accurately limiting the output power of an amplifier circuit.

A radio-frequency circuit according to an aspect of the present disclosure includes an amplifier circuit, a bias circuit, a bias control circuit, a comparing section, a signal input terminal, an antenna terminal, an attenuation circuit, and a control unit. The amplifier circuit includes a specific transistor. The specific transistor has an input terminal and an output terminal. The specific transistor amplifies a radio-frequency signal input to the input terminal and outputs the radio-frequency signal from the output terminal. The bias circuit supplies a bias current or a bias voltage to the input terminal of the specific transistor. The bias control circuit supplies a control current or a control voltage to the bias circuit. The comparing section compares a threshold voltage with a power supply voltage of a power supply terminal connected to the output terminal of the specific transistor. The signal input terminal is connected to the input terminal of the specific transistor, and the radio-frequency signal is input to the signal input terminal. The attenuation circuit is connected in a signal path between the signal input terminal and the antenna terminal and is capable of attenuating the radio-frequency signal. The control unit changes an attenuation of the attenuation circuit in accordance with a compared result off the comparing section.

A communication device according to an aspect of the present disclosure includes the radio-frequency circuit and a signal processing circuit. The signal processing circuit is connected to the radio-frequency circuit.

With the radio-frequency circuit and the communication device according to the above-described aspects of the present disclosure, it is possible to further accurately limit the output power of the amplifier circuit.

DETAILED DESCRIPTION

First Embodiment

Figure 1:
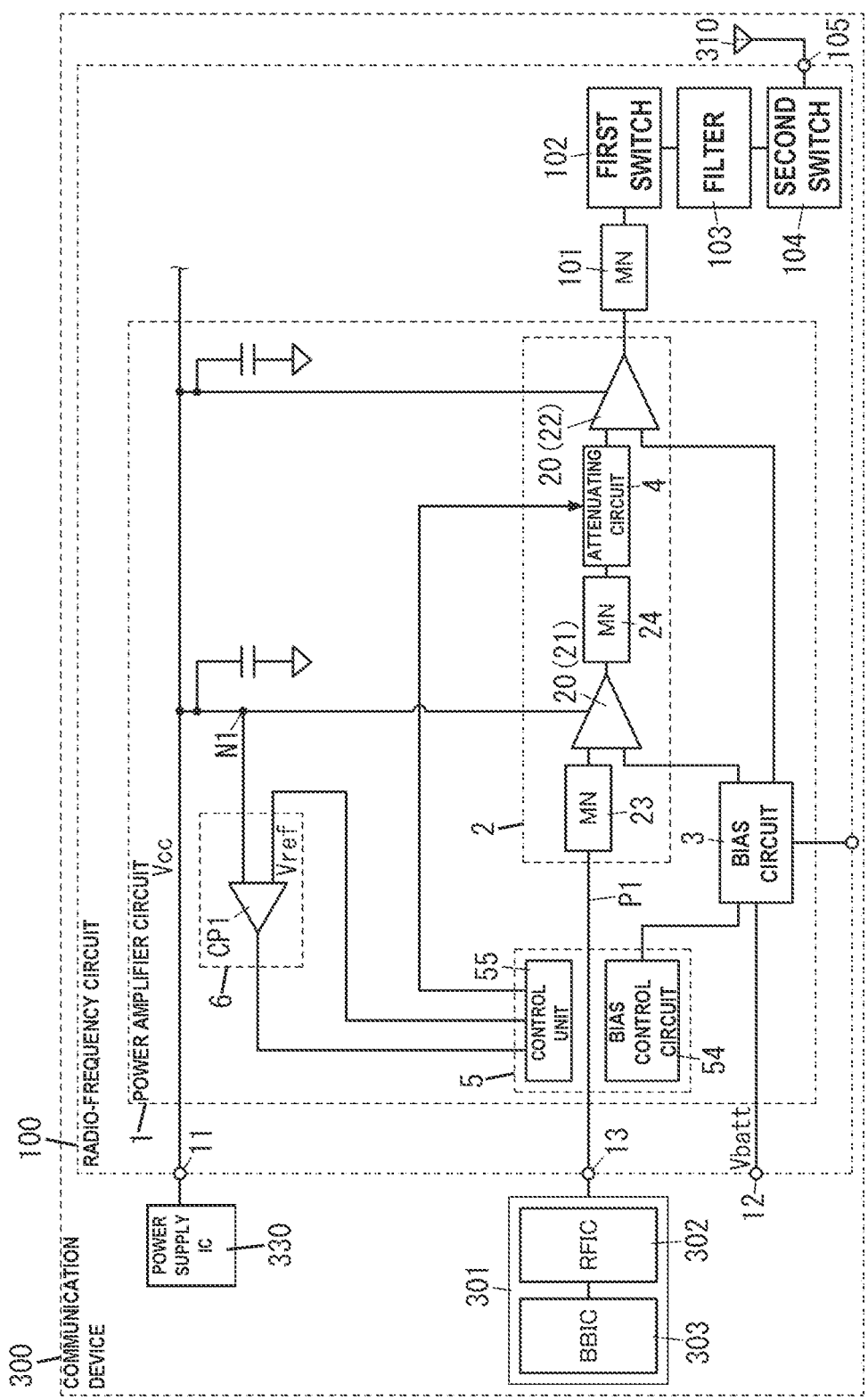
FIG. 1 is a circuit diagram of a radio-frequency circuit and a communication device according to a first embodiment.

Hereinafter, a radio-frequency circuit 100 and a communication device 300 according to a first embodiment will be described with reference to FIGS. 1 to 4C.

(1) Radio-Frequency Circuit and Communication Device
(1.1) Circuit Configuration of Radio-Frequency Circuit and Communication Device The radio-frequency circuit 100 according to the first embodiment is used in, for example, the communication device 300. The communication device 300 is, for example, a mobile phone (for example, a smartphone); however, the configuration is not limited thereto. The communication device 300 may be, for example, a wearable terminal (for example, a smart watch). The radio-frequency circuit 100 is, for example, a circuit that supports a 4G (fourth generation mobile communication) standard, a 5G (fifth generation mobile communication) standard, or the like. The 4G standard is, for example, a 3GPP long term evolution (LTE) standard. The 5G standard is, for example, 5G new ratio (NR). The radio-frequency circuit 100 may be a circuit that supports carrier aggregation and dual connectivity.

The radio-frequency circuit 100 is, for example, configured to be capable of amplifying a transmission signal (radio-frequency signal) input from the signal processing circuit 301 and outputting the transmission signal to an antenna 310. The signal processing circuit 301 is not a component element of the radio-frequency circuit 100 but a component element of the communication device 300 that includes the radio-frequency circuit 100. The radio-frequency circuit 100 is, for example, controlled by the signal processing circuit 301 of the communication device 300. The communication device 300 includes the radio-frequency circuit 100 and the signal processing circuit 301. The communication device 300 further includes the antenna 310.

The signal processing circuit 301 includes, for example, an RF signal processing circuit 302 and a baseband signal processing circuit 303. The RF signal processing circuit 302 is, for example, a radio frequency integrated circuit (RFIC), and performs signal processing on a radio-frequency signal. The RF signal processing circuit 302, for example, performs signal processing on a radio-frequency signal (transmission signal) output from the baseband signal processing circuit 303 by up conversion, or the like and outputs the processed radio-frequency signal. The baseband signal processing circuit 303 is, for example, a baseband integrated circuit (BBIC). The baseband signal processing circuit 303 generates an I-phase signal and a Q-phase signal from a baseband signal. The baseband signal is, for example, an audio signal, an image signal, or the like input from the outside. The baseband signal processing circuit 303 performs IQ modulation process by synthesizing the I-phase signal with the Q-phase signal and outputs a transmission signal. At this time, the transmission signal is generated as a modulation signal (IQ signal) obtained by modulating the amplitude of a carrier wave signal with a predetermined frequency at a period longer than the period of the carrier wave signal. The radio-frequency circuit 100 transmits a radio-frequency signal (transmission signal) between the antenna 310 and the RF signal processing circuit 302 of the signal processing circuit 301.

The radio-frequency circuit 100 includes a power amplifier circuit 1. The radio-frequency circuit 100 further includes an output matching circuit 101, a first switch 102, a filter 103, a second switch 104, and an antenna terminal 105.

The power amplifier circuit 1 includes an amplifier circuit 2. The amplifier circuit 2, for example, amplifies an input signal input from the signal processing circuit 301 via a signal input terminal 13 of the radio-frequency circuit 100 and outputs the input signal. The input signal is a radio-frequency signal (transmission signal) in a predetermined frequency band. The predetermined frequency band includes, for example, a plurality of communication bands different from each other. The amplifier circuit 2 has a plurality of (two in the illustrated example) amplifiers 20.

Figure 2:
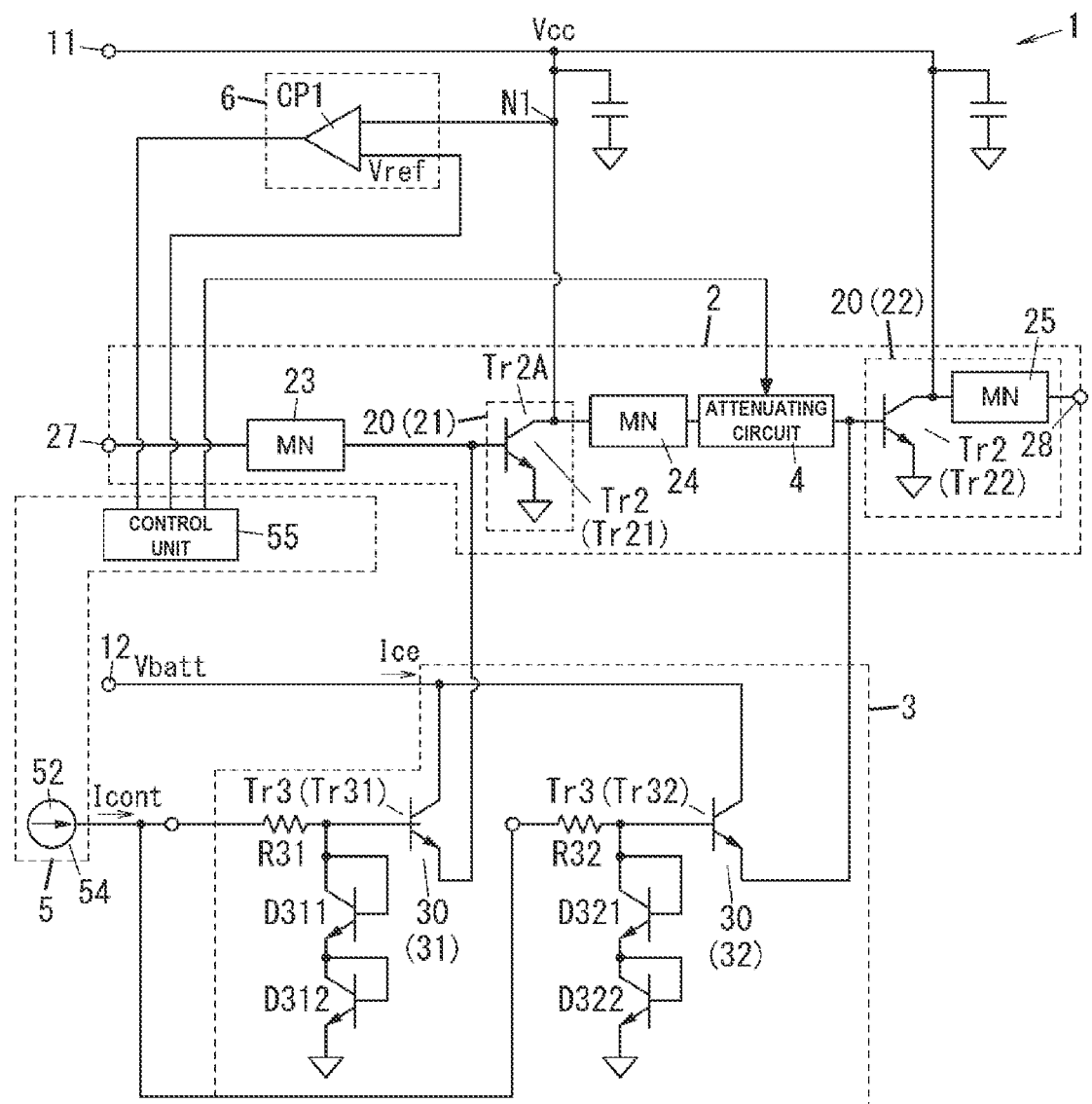
FIG. 2 is a circuit diagram of a power amplifier circuit of the above-described radio-frequency circuit.

Each of the plurality of amplifiers 20 includes an amplifier transistor Tr2 (see FIG. 2). Each of the plurality of transistors Tr2 has an input terminal and an output terminal. Each of the plurality of transistors Tr2 has an input/output common terminal. Each of the plurality of transistors Tr2 is, for example, a bipolar transistor. In this case, the input terminal, output terminal, and common terminal of the transistor Tr2 are respectively the base, collector, and emitter of the bipolar transistor. In the amplifier circuit 2, the common terminal (emitter) of each transistor Tr2 is connected to a ground (grounded).

In the amplifier circuit 2, the plurality of amplifiers 20 is connected in multiple stages. Therefore, in the amplifier circuit 2, the plurality of transistors Tr2 is connected in multiple stages. Hereinafter, for the sake of convenience of description, of the plurality of amplifiers 20, the amplifier 20 in the first stage (driver stage) is referred to as first-stage amplifier 21, and the amplifier 20 in the final stage is referred to as final-stage amplifier 22. Of the plurality of transistors Tr2, the transistor Tr2 in the first stage (driver stage) is referred to as first-stage transistor Tr21, and the transistor Tr2 in the final stage (output stage) is referred to as final-stage transistor Tr22.

The amplifier circuit 2 further includes a matching circuit 23 provided between an input terminal 27 and the first-stage amplifier 21, and a matching circuit 24 provided between the first-stage amplifier 21 and the final-stage amplifier 22. The matching circuit 23 is a circuit for matching the impedance between the first-stage amplifier 21 and the signal processing circuit 301. The matching circuit 24 is a circuit (inter-stage matching circuit) for matching the impedance between the first-stage amplifier 21 and the final-stage amplifier 22.

The output matching circuit 101 is provided in a signal path between the amplifier circuit 2 and the first switch 102. The output matching circuit 101 is a circuit for matching the impedance between the amplifier circuit 2 and the filter 103. The output matching circuit 101 is made up of, for example, one inductor; however, the configuration is not limited thereto. The output matching circuit 101 may include, for example, a plurality of inductors and a plurality of capacitors.

The first switch 102 is provided between the output matching circuit 101 and the filter 103. The first switch 102 has a common terminal and a plurality of selection terminals. The common terminal of the first switch 102 is connected to the amplifier circuit 2 via the output matching circuit 101. One of the plurality of selection terminals of the first switch 102 is connected to the filter 103. The first switch 102 is, for example, a switch capable of connecting at least one of the plurality of selection terminals to the common terminal. Here, the first switch 102 is, for example, a switch capable of one-to-one connection and one-to-multiple connection. The first switch 102 is a switch capable of switching between signal paths for a plurality of transmission signals in communication bands different from each other. The first switch 102, for example, switches a connection status between the common terminal and the plurality of selection terminals in accordance with a control signal input from the signal processing circuit 301. The first switch 102 is, for example, a switch integrated circuit (IC).

The filter 103 is a filter that has a transmission band of at least one communication band (for example, Band 3) of the above-described plurality of communication bands as a pass band. The filter 103 is, for example, a one-chip acoustic wave filter. In the filter 103, each of a plurality of series arm resonators and a plurality of parallel arm resonators is made up of an acoustic wave resonator. The acoustic wave filter is, for example, a surface acoustic wave filter that uses surface acoustic waves. In the surface acoustic wave filter, each of the plurality of series arm resonators and the plurality of parallel arm resonators is, for example, a surface acoustic wave (SAW) resonator.

The second switch 104 is provided between the filter 103 and the antenna terminal 105. The second switch 104 is a switch connected to the antenna terminal 105. The second switch 104 has a common terminal and a plurality of selection terminals. The common terminal of the second switch 104 is connected to the antenna terminal 105. One of the plurality of selection terminals of the second switch 104 is connected to the filter 103. The second switch 104, for example, switches a connection status between the common terminal and the plurality of selection terminals in accordance with a control signal input from the signal processing circuit 301. The second switch 104 is, for example, a switch IC.

The antenna terminal 105 is connected to the antenna 310.

In the radio-frequency circuit 100, a transmission signal output from the amplifier circuit 2 is transmitted to the antenna 310 through the output matching circuit 101, the first switch 102, the filter 103, the second switch 104, and the antenna terminal 105.

(1.2) Circuit Configuration of Power Amplifier Circuit

As shown in FIG. 2, the power amplifier circuit 1 includes the amplifier circuit 2, a bias circuit 3, a bias control circuit 54, a comparing section 6, an attenuation circuit 4, and a control unit 55. The amplifier circuit 2 includes a specific transistor Tr2A (for example, the first-stage transistor Tr2). The specific transistor Tr2A has an input terminal and an output terminal. The specific transistor Tr2A amplifies a radio-frequency signal input to the input terminal and outputs the radio-frequency signal from the output terminal. The bias circuit 3 supplies a bias current to the input terminal of the specific transistor Tr2A; however, the configuration is not limited thereto. The bias circuit 3 may be configured to supply a bias voltage to the input terminal of the specific transistor Tr2A. The bias control circuit 54 supplies a control current Icont to the bias circuit 3; however, the configuration is not limited thereto. The bias control circuit 54 may be configured to supply a control voltage to the bias circuit 3. The comparing section 6 compares a threshold voltage (reference voltage) Vref with a power supply voltage Vcc of a power supply terminal 11 connected to the output terminal of the specific transistor Tr2A. The attenuation circuit 4 is connected in a signal path P1 (see FIG. 1) between the signal input terminal 13 and the antenna terminal 105 and is capable of attenuating a radio-frequency signal. The control unit 55 controls the attenuation circuit 4.

The amplifier circuit 2 includes a plurality of (two in the illustrated example) amplifier transistors Tr2 (see FIG. 2). Each of the plurality of transistors Tr2 has an input terminal and an output terminal. Each of the plurality of transistors Tr2 has an input/output common terminal. Each of the plurality of transistors Tr2 is, for example, a bipolar transistor. In this case, the input terminal, output terminal, and common terminal of the transistor Tr2 are respectively the base, collector, and emitter of the bipolar transistor. In the amplifier circuit 2, the common terminal (emitter) of each transistor Tr2 is connected to a ground (grounded).

In the amplifier circuit 2, the plurality of transistors Tr2 is connected in multiple stages. Hereinafter, for the sake of convenience of description, of the plurality of transistors Tr2, the transistor Tr2 in the first stage (driver stage) is referred to as first-stage transistor Tr21, and the transistor Tr2 in the final stage (output stage) is referred to as final-stage transistor Tr22.

The amplifier circuit 2 has the input terminal 27 and an output terminal 28. In the amplifier circuit 2, the input terminal (base) of the first-stage transistor Tr21 is connected to the input terminal 27 via the matching circuit 23. The output terminal (collector) of the first-stage transistor Tr21 is connected to the power supply terminal 11. The output terminal (collector) of the first-stage transistor Tr21 is connected to the input terminal (base) of the final-stage transistor Tr22 via the matching circuit 24. The common terminal (emitter) of the first-stage transistor Tr21 is grounded. The first-stage transistor Tr2 amplifies an input signal input to the input terminal and outputs the input signal from the output terminal.

The input terminal (base) of the final-stage transistor Tr22 is connected to the output terminal (collector) of the first-stage transistor Tr21 via the matching circuit 24. The output terminal (collector) of the final-stage transistor Tr22 is connected to the power supply terminal 11. The output terminal of the final-stage transistor Tr22 is connected to the output terminal 28 via a matching circuit 25. The common terminal (emitter) of the final-stage transistor Tr22 is grounded.

The amplifier circuit 2 may have the matching circuit 25 provided between the output terminal of the final-stage transistor Tr22 and the output terminal 28 of the amplifier circuit 2.

The amplifier circuit 2 amplifies an input transmission signal with the first-stage transistor Tr21, further amplifies the transmission signal with the final-stage transistor Tr22, and outputs the transmission signal. In other words, the final-stage transistor Tr22 further amplifies the transmission signal amplified by the first-stage transistor Tr21 and outputs the transmission signal.

The bias circuit 3 has two emitter followers 30 in a one-to-one correspondence with the two transistors Tr2. Each of the two emitter followers 30 includes a bipolar transistor Tr3. Each of the two emitter followers 30 supplies a bias current to the base of an associated one of the two transistors Tr2. The two bipolar transistors Tr3 are bias transistors.

The bias circuit 3 has the plurality of (two in the illustrated example) emitter followers 30 in a one-to-one correspondence with the plurality of (two in the illustrated example) transistors Tr2. Hereinafter, regarding the two emitter followers 30, the emitter follower 30 associated with the first-stage transistor Tr21 may be referred to as first emitter follower 31, and the emitter follower 30 associated with the final-stage transistor Tr22 may be referred to as second emitter follower 32. Regarding the two bipolar transistors Tr3, the bipolar transistor Tr3 included in the first emitter follower 31 may be referred to as first bipolar transistor Tr31, and the bipolar transistor Tr3 included in the second emitter follower 32 may be referred to as second bipolar transistor Tr32.

The base of the first bipolar transistor Tr31 is connected to a current source 52 via a resistance R31. The emitter of the second bipolar transistor Tr31 is connected to the input terminal (base) of the first-stage transistor Tr21. The collector of the first bipolar transistor Tr31 is connected to a battery terminal 12 of the radio-frequency circuit 100. The base of the second bipolar transistor Tr32 is connected to the current source 52 included in the bias control circuit 54 via a resistance R32. The emitter of the second bipolar transistor Tr32 is connected to the input terminal (base) of the final-stage transistor Tr22. The collector of the second bipolar transistor Tr32 is connected to the battery terminal 12. In the bias circuit 3, a current Ice from the battery terminal 12 is supplied to a junction point between the collectors of the plurality of bipolar transistors Tr3.

The bias control circuit 54 includes the current source 52 as described above. The current source 52 supplies the control current Icont to the base of each of the first bipolar transistor Tr31 and the second bipolar transistor Tr32. The control current Icont is a constant current.

The first emitter follower 31 supplies a bias current from the emitter of the first bipolar transistor Tr31 to the input terminal (base) of the first-stage transistor Tr21. The bias current is a bias signal for controlling a bias point (operating point) of the first-stage transistor Tr21.

The second emitter follower 32 supplies a bias current from the emitter of the second bipolar transistor Tr32 to the input terminal (base) of the final-stage transistor Tr22. The bias current is a bias signal for controlling a bias point (operating point) of the final-stage transistor Tr22.

Two diodes D311, D312 are connected in series between the ground and the base of the first bipolar transistor Tr31 included in the first emitter follower 31. Each of the two diodes D311, D312 is configured to connect the base and collector of an npn transistor.

Two diodes D321, D322 are connected in series between the ground and the base of the second bipolar transistor Tr32 included in the second emitter follower 32. Each of the two diodes D321, D322 is configured to connect the base and collector of an npn transistor.

The amplifier circuit 2 and the bias circuit 3 are included in, for example, one IC chip. The IC chip including the amplifier circuit 2 and the bias circuit 3 is, for example, a GaAs IC chip. In this case, each of the two transistors Tr2 is, for example, a heterojunction bipolar transistor (HBT).

The IC chip including the amplifier circuit 2 and the bias circuit 3 is not limited to a GaAs IC chip, and may be, for example, an Si IC chip having the amplifier circuit 2 or an SiGe IC chip having the amplifier circuit 2.

The bias control circuit 54 supplies the control current Icont to the bias circuit 3. The radio-frequency circuit 100 has a control circuit 5 including the bias control circuit 54. The control circuit 5 is, for example, a control IC that controls the amplifier circuit 2 and the bias circuit 3. When the bias circuit 3 has a plurality of (here, two) emitter followers 30, the current Ice from the battery terminal 12 is diverted to the plurality of emitter followers 30. The control current Icont from the bias control circuit 54 is diverted to the bases of the two bipolar transistors Tr3 of the bias circuit 3.

The comparing section 6 compares the threshold voltage Vref with the power supply voltage Vcc of the power supply terminal 11 connected to the output terminal (collector) of the specific transistor Tr2A (here, the first-stage transistor Tr21). The power supply terminal 11 is, for example, a terminal connected to a power management integrated circuit (IC) 330 of the communication device 300 and supplied with the power supply voltage Vcc from the power management IC 330.

The comparing section 6 includes a comparator CP1 that compares a threshold voltage Vref with the power supply voltage Vcc of the power supply terminal 11. The comparator CP1 has a first input terminal, a second input terminal, and an output terminal. The first input terminal of the comparator CP1 is connected to a node N1 between the power supply terminal 11 and the output terminal (collector) of the first-stage transistor Tr21. The first input terminal of the comparator CP1 is connected to the power supply terminal 11 without necessarily intervening a circuit element. Therefore, no circuit element that generates a voltage drop, such as a resistive element, is provided between the power supply terminal 11 and the node N1. Thus, the power supply voltage Vcc is applied to the first input terminal of the comparator CP1. The threshold voltage Vref is applied from the control unit 55 of the control circuit 5 to the second input terminal of the comparator CP1. The output terminal of the comparator CP1 is connected to the control unit 55.

In the comparator CP1, for example, the first input terminal is a non-inverting input terminal, and the second input terminal is an inverting input terminal. In the comparing section 6, when the power supply voltage Vcc does not exceed the threshold voltage Vref, the signal level (voltage level) of an output signal from the output terminal of the comparator CP1 is a first level (also referred to as low level). In the comparing section 6, when the power supply voltage Vcc exceeds the threshold voltage Vref, the signal level of an output signal from the output terminal of the comparator CP1 is a second level (also referred to as high level) higher than the first level.

The attenuation circuit 4 is connected in the signal path P1 between the signal input terminal 13 and the antenna terminal 105. More specifically, the attenuation circuit 4 is connected between the output terminal of the first-stage transistor Tr21 serving as the specific transistor Tr2A and the input terminal of the final-stage transistor Tr22.

Figure 3A:
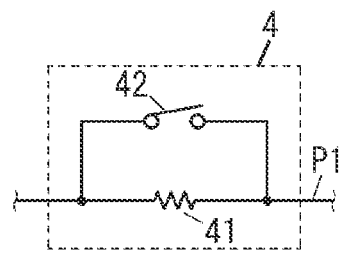
FIG. 3A is a circuit diagram of an attenuation circuit of the above-described radio-frequency circuit.

As shown in FIG. 3A, the attenuation circuit 4 includes a resistive element 41 and a switch element 42. The resistance value of the attenuation circuit 4 is changed in accordance with a compared result of the comparing section 6. The attenuation circuit 4 is, for example, controlled by the control unit 55. The switch element 42 is, for example, a semiconductor switch element having a control terminal and a pair of main terminals, and the control unit 55 is connected to the control terminal. The semiconductor switch element is, for example, a normally-on metal-oxide-semiconductor field effect transistor (MOSFET).

The control unit 55 increases the resistance value of the attenuation circuit 4 when the power supply voltage Vcc is higher than the threshold voltage Vref as compared to when the power supply voltage Vcc is lower than the threshold voltage Vref. In the radio-frequency circuit 100, when the signal level of the output signal of the comparator CP1 is the first level, the control unit 55 controls the switch element 42 of the attenuation circuit 4 to an on state; whereas, when the signal level of the output signal of the comparator CP1 is the second level, the control unit 55 controls the switch element 42 of the attenuation circuit 4 to an off state. Therefore, in the attenuation circuit 4, when the power supply voltage Vcc is lower than the threshold voltage Vref, the resistance value of the attenuation circuit 4 is substantially zero (about the on resistance of the switch element 42); whereas, when the power supply voltage Vcc is higher than the threshold voltage Vref, the resistance value of the attenuation circuit 4 is the resistance value of the resistive element 41. The resistance value of the resistive element 41 is greater than the on resistance of the switch element 42. The threshold voltage Vref is a voltage higher by a predetermined voltage (for example, greater than or equal to 0.1 V and less than or equal to 0.2 V) than the rated power supply voltage of the power supply voltage Vcc.

The control circuit 5 further includes the control unit 55 that controls the attenuation circuit 4 as described above. The control unit 55 controls the attenuation circuit 4 in accordance with a compared result of the comparing section 6. In other words, the control unit 55 controls the switch element 42 of the attenuation circuit 4 in accordance with an output signal of the comparator CP1.

The control circuit 5 and the comparator CP1 are included in, for example, one IC chip. The IC chip including the control circuit 5 and the comparator CP1 is, for example, an Si IC chip.

The control circuit 5 is connected to, for example, the signal processing circuit 301. The control circuit 5 controls the amplifier circuit 2 and the bias circuit 3 in accordance with a control signal acquired from the signal processing circuit 301. The control circuit 5 controls the amplifier circuit 2 and the bias circuit 3 in accordance with a control signal from the RF signal processing circuit 302 of the signal processing circuit 301.

(1.3) Operation of Radio-Frequency Circuit

In the radio-frequency circuit 100, the power amplifier circuit 1, for example, amplifies a transmission signal from the signal processing circuit 301 and outputs the transmission signal. In the power amplifier circuit 1, the amplifier circuit 2 amplifies an input signal that is an input transmission signal in a predetermined frequency band and outputs the input signal.

In the power amplifier circuit 1, when the power supply voltage Vcc of the power supply terminal 11 is the rated power supply voltage, the power supply voltage Vcc does not exceed the threshold voltage Vref, and the signal level of the output signal of the comparator CP1 is the first level. When the output signal of the comparator CP1 is the first level, the control unit 55 sets the switch element 42 of the attenuation circuit 4 to an on state. Thus, a radio-frequency signal that passes through the attenuation circuit 4 and enters the input terminal of the final-stage transistor Tr22 is not attenuated.

In the power amplifier circuit 1, when the power supply voltage Vcc of the power supply terminal 11 becomes a voltage higher by a predetermined voltage (for example, greater than or equal to 0.1 V and less than or equal to 0.2 V) or greater than the rated power supply voltage, the power supply voltage Vcc exceeds the threshold voltage Vref, and the signal level of the output signal of the comparator CP1 is the second level. When the output signal of the comparator CP1 is the second level, the control unit 55 sets the switch element 42 of the attenuation circuit 4 to an off state. Thus, a radio-frequency signal that passes through the attenuation circuit 4 and enters the input terminal of the final-stage transistor Tr22 is attenuated by the attenuation circuit 4. Thus, in the power amplifier circuit 1, the output power of the final-stage transistor Tr22 is limited. In this way, in the power amplifier circuit 1, the input voltage-output voltage characteristics of the amplifier circuit 2 depend on the magnitude relation between the power supply voltage Vcc and the threshold voltage Vref.

(2) Summary (2.1) Radio-Frequency Circuit

A radio-frequency circuit 100 according to the first embodiment includes an amplifier circuit 2, a bias circuit 3, a bias control circuit 54, a comparing section 6, a signal input terminal 13, an antenna terminal 105, an attenuation circuit 4, and a control unit 55. The amplifier circuit 2 includes a specific transistor Tr2A. The specific transistor Tr2A has an input terminal and an output terminal. The specific transistor Tr2A amplifies a radio-frequency signal input to the input terminal and outputs the radio-frequency signal from the output terminal. The bias circuit 3 supplies a bias current Icont or a bias voltage to the input terminal of the specific transistor Tr2A. The bias control circuit 54 supplies a control current or a control voltage to the bias circuit 3. The comparing section 6 compares a threshold voltage Vref with a power supply voltage Vcc of a power supply terminal 11 connected to the output terminal of the specific transistor Tr2A. The signal input terminal 13 is connected to the input terminal of the specific transistor Tr2A, and a radio-frequency signal is input to the signal input terminal 13. The attenuation circuit 4 is connected in a signal path P1 between the signal input terminal 13 and the antenna terminal 105 and is capable of attenuating a radio-frequency signal. The control unit 55 changes an attenuation of the attenuation circuit 4 in accordance with a compared result of the comparing section 6.

In the radio-frequency circuit 100 according to the first embodiment, the control unit 55 changes the attenuation of the attenuation circuit 4 in accordance with a compared result of the comparing section 6. Therefore, when, for example, the power supply voltage Vcc exceeds the threshold voltage Vref, it is possible to attenuate a radio-frequency signal. In other words, with the radio-frequency circuit 100 according to the first embodiment, the output power of the amplifier circuit 2 is further accurately limited.

In the radio-frequency circuit 100 according to the first embodiment, the attenuation circuit 4 is made up of a resistive element 41 and a switch element 42. Therefore, the small-sized attenuation circuit 4 is implemented with a simple configuration.

A radio-frequency module including the radio-frequency circuit 100 includes a plurality of circuit elements (a GaAs IC chip and an Si IC chip of the power amplifier circuit 1, the first switch 102, the filter 103, the second switch 104, and the like) included in the radio-frequency circuit 100, and a mounting substrate on which the plurality of circuit elements is mounted. In the radio-frequency module, to reduce the size of the radio-frequency module, a reduction in the size of the filter 103 of which a footprint on the mounting substrate tends to increase, of the plurality of circuit elements, can be attempted. Here, the power handling capability of the filter 103 tends to decrease as the chip size of the filter 103 reduces. In the radio-frequency circuit 100 according to the embodiment, the output power of the amplifier circuit 2 can be accurately limited, so, for example, the degradation of the characteristics of the filter 103 can be suppressed, with the result that the design margin of the filter 103 is easily expanded.

(2.2) Communication Device

A communication device 300 according to the first embodiment includes the radio-frequency circuit 100 and a signal processing circuit 301. The signal processing circuit 301 is connected to the radio-frequency circuit 100.

The communication device 300 according to the first embodiment includes the radio-frequency circuit 100, so the communication device 300 is capable of further accurately limiting the output power of the amplifier circuit 2.

(3) Modifications

Hereinafter, modifications of the first embodiment will be listed. The modifications described below are applicable in combination as needed.

(3.1) First Modification

In the radio-frequency circuit 100, an attenuation circuit 4a may be applied instead of the attenuation circuit 4. Hereinafter, the attenuation circuit 4a will be described with reference to FIG. 3B.

Figure 3B:
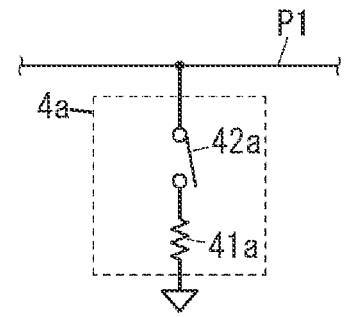
FIG. 3B is a circuit diagram of an attenuation circuit of a radio-frequency circuit according to a first modification of the first embodiment.

As shown in FIG. 3B, the attenuation circuit 4a includes a resistive element 41a and a switch element 42a. In the attenuation circuit 4a, the resistive element 41a and the switch element 42a are connected in series such that the switch element 42a is on the signal path P1 side and the resistive element 41a is on the ground side. In other words, the attenuation circuit 4a is connected between the signal path P1 and the ground.

The control unit 55 changes the attenuation of the attenuation circuit 4a in accordance with a compared result of the comparing section 6. Specifically, the control unit 55 controls the switch element 42a to an on state when the power supply voltage Vcc exceeds the threshold voltage Vref, and controls the switch element 42a to an off state when the power supply voltage Vcc is lower than or equal to the threshold voltage Vref. Thus, when the power supply voltage Vcc exceeds the threshold voltage Vref, the resistive element 41a is connected to the signal path P1, with the result that a radio-frequency signal is attenuated.

With the radio-frequency circuit 100 according to the first modification, the small-sized attenuation circuit 4a is implemented with a simple configuration.

In FIG. 3B, the number of the resistive elements 41a is one. Alternatively, the number of the resistive elements 41a may be multiple. In this case, the plurality of resistive elements 41a may be connected in series or may be connected in parallel or may be in a combination of series and parallel connections.

(3.2) Second Modification

In the radio-frequency circuit 100, an attenuation circuit 4b may be applied instead of the attenuation circuit 4. Hereinafter, the attenuation circuit 4b will be described with reference to FIG. 3C.

Figure 3C:
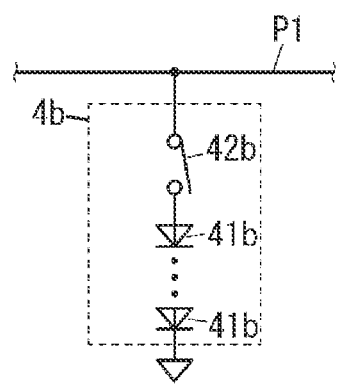
FIG. 3C is a circuit diagram of an attenuation circuit of a radio-frequency circuit according to a second modification of the first embodiment.

As shown in FIG. 3C, the attenuation circuit 4b includes a plurality of rectifier elements 41b and a switch element 42b. Each of the plurality of rectifier elements 41b is, for example, a diode. In the attenuation circuit 4b, the plurality of rectifier elements 41b is connected in series with each other. In the attenuation circuit 4b, the plurality of rectifier elements 41b and the switch element 42b are connected in series such that the switch element 42b is on the signal path P1 side and the plurality of rectifier elements 41b is on the ground side. In other words, the attenuation circuit 4b is connected between the signal path P1 and the ground.

The control unit 55 changes the attenuation of the attenuation circuit 4b in accordance with a compared result of the comparing section 6. Specifically, the control unit 55 controls the switch element 42b to an on state when the power supply voltage Vcc exceeds the threshold voltage Vref, and controls the switch element 42b to an off state when the power supply voltage Vcc is lower than or equal to the threshold voltage Vref. Thus, when the power supply voltage Vcc exceeds the threshold voltage Vref, the plurality of rectifier elements 41b is connected to the signal path P1, with the result that a radio-frequency signal is attenuated.

With the radio-frequency circuit 100 according to the second modification, the small-sized attenuation circuit 4b is implemented with a simple configuration. In the radio-frequency circuit 100 according to the second modification, the rectifier elements 41b are used, so the output power can be limited to lower than or equal to a certain value. In other words, with the radio-frequency circuit 100 according to the second modification, an increase in input current can be handled.

In FIG. 3C, the plurality of rectifier elements 41b is connected in series. Alternatively, the plurality of rectifier elements 41b may be connected in parallel or may be in a combination of series and parallel connections. The number of the rectifier elements 41b is not limited to multiple. The number of the rectifier elements 41b may be one.

(3.3) Third Modification

In the radio-frequency circuit 100, an attenuation circuit 4c may be applied instead of the attenuation circuit 4. Hereinafter, the attenuation circuit 4c will be described with reference to FIG. 3D.

Figure 3D:
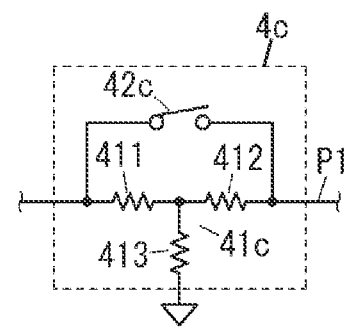
FIG. 3D is a circuit diagram of an attenuation circuit of a radio-frequency circuit according to a third modification of the first embodiment.

As shown in FIG. 3D, the attenuation circuit 4c includes a T-shape circuit 41c and a switch element 42c. The T-shape circuit 41c has two first resistive elements 411, 412 and a second resistive element 413. The two first resistive elements 411, 412 are connected in series with each other and connected in series with the signal path P1. The second resistive element 413 is connected between a ground and a junction point between the two first resistive elements 411, 412. The switch element 42c is connected in parallel with the two first resistive elements 411, 412 connected in series with the signal path P1 in the T-shape circuit 41c. In other words, in the attenuation circuit 4c, the switch element 42c and the T-shape circuit 41c are connected in parallel.

The control unit 55 changes the attenuation of the attenuation circuit 4c in accordance with a compared result of the comparing section 6. Specifically, the control unit 55 controls the switch element 42c to an off state when the power supply voltage Vcc exceeds the threshold voltage Vref, and controls the switch element 42c to an on state when the power supply voltage Vcc is lower than or equal to the threshold voltage Vref. Thus, when the power supply voltage Vcc exceeds the threshold voltage Vref, the T-shape circuit 41c is connected to the signal path P1, with the result that a radio-frequency signal is attenuated.

With the radio-frequency circuit 100 according to the third modification, fluctuations in the impedance are suppressed by connecting the T-shape circuit 41c to the signal path P1, so fluctuations in RF characteristics are suppressed.

In FIG. 3D, the number of the second resistive elements 413 is one. Alternatively, the number of the second resistive elements 413 may be multiple. In the third modification, the number of the parallel circuits made up of the switch element 42c and the T-shape circuit 41c is one. Alternatively, two or more parallel circuits may be connected to the signal path P1.

(3.4) Fourth Modification

In the radio-frequency circuit 100, an attenuation circuit 4d may be applied instead of the attenuation circuit 4. Hereinafter, the attenuation circuit 4d will be described with reference to FIG. 3E.

Figure 3E:
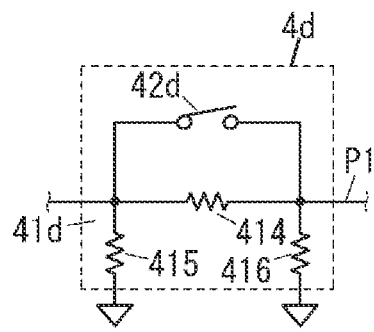
FIG. 3E is a circuit diagram of an attenuation circuit of a radio-frequency circuit according to a fourth modification of the first embodiment.

As shown in FIG. 3E, the attenuation circuit 4d includes a π-shape circuit 41d and a switch element 42d. The π-shape circuit 41d has a first resistive elements 414 and two second resistive elements 415, 416. The first resistive element 414 is connected in series with the signal path P1. Each of the two second resistive elements 415, 416 is connected between the signal path P1 and the ground. The switch element 42d is connected in parallel with the first resistive element 414 connected in series with the signal path P1 in the π-shape circuit 41d. In other words, in the attenuation circuit 4d, the switch element 42d and the π-shape circuit 41d are connected in parallel.

The control unit 55 changes the attenuation of the attenuation circuit 4c in accordance with a compared result of the comparing section 6. Specifically, the control unit 55 controls the switch element 42d to an off state when the power supply voltage Vcc exceeds the threshold voltage Vref, and controls the switch element 42d to an on state when the power supply voltage Vcc is lower than or equal to the threshold voltage Vref. Thus, when the power supply voltage Vcc exceeds the threshold voltage Vref, the π-shape circuit 41d is connected to the signal path P1, with the result that a radio-frequency signal is attenuated.

In FIG. 3E, the number of the first resistive elements 414 is one. Alternatively, the number of the first resistive elements 414 may be multiple. Each of the number of the second resistive elements 415 and the number of the second resistive elements 416 is one. Alternatively, each of the number of the second resistive elements 415 and the number of the second resistive elements 416 may be multiple. Furthermore, in the fourth modification, the number of the parallel circuits made up of the switch element 42d and the π-shape circuit 41d is one. Alternatively, two or more parallel circuits may be connected to the signal path P1.

(3.5) Fifth Modification

In the radio-frequency circuit 100, an attenuation circuit 4e may be applied instead of the attenuation circuit 4. Hereinafter, the attenuation circuit 4e will be described with reference to FIG. 4A.

Figure 4A:
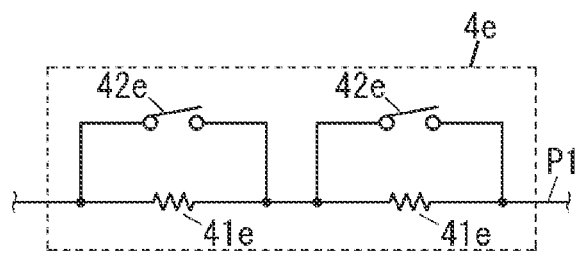
FIG. 4A is a circuit diagram of an attenuation circuit of a radio-frequency circuit according to a fifth modification of the first embodiment.

As shown in FIG. 4A, the attenuation circuit 4e includes a plurality of (two in the illustrated example) resistive elements 41e and a plurality of (two in the illustrated example) switch elements 42e. The plurality of resistive elements 41e and the plurality of switch elements 42e are provided in a one-to-one correspondence with each other. The plurality of resistive elements 41e is connected in series with each other and connected in series with the signal path P1. Each of the plurality of switch elements 42e is connected in parallel with an associated one of the plurality of resistive elements 41e. In other words, the attenuation circuit 4e has two parallel circuits each made up of one resistive element 41e and one switch element 42e. The two parallel circuits are connected in series with each other.

In the radio-frequency circuit 100 according to the fifth modification, the amplifier circuit 2, as in the case of the amplifier circuit 2 of the radio-frequency circuit 100 according to the first embodiment, is capable of operating in each of a plurality of (for example, two) communication bands (a first communication band and a second communication band) different from each other. Therefore, the specific transistor Tr2A is capable of operating in each of the plurality of communication bands different from each other. In the radio-frequency circuit 100 according to the fifth modification, the control unit 55 changes the attenuation of the attenuation circuit 4e in accordance with, of the plurality of communication bands, the communication band in which the specific transistor Tr2A operates. The control unit 55 can acquire information related to the communication band in which the specific transistor Tr2A operates from the signal processing circuit 301. The control unit 55 can change the attenuation of the attenuation circuit 4e in accordance with, for example, a compared result of the comparing section 6, and a control signal from the signal processing circuit 301.

In the radio-frequency circuit 100 according to the fifth modification, the control unit 55 sets all the plurality of switch elements 42e to an on state when, for example, the power supply voltage Vcc is lower than the threshold voltage Vref in accordance with a compared result of the comparing section 6. When the control unit 55 is configured to set the attenuation of the attenuation circuit 4e to a maximum value in accordance with the first communication band when, for example, the power supply voltage Vcc is higher than the threshold voltage Vref in accordance with a compared result of the comparing section 6, the control unit 55 sets all the plurality of switch elements 42e to an off state. When the control unit 55 is configured to set the attenuation of the attenuation circuit 4e to a minimum value in accordance with the second communication band when, for example, the power supply voltage Vcc is higher than the threshold voltage Vref in accordance with a compared result of the comparing section 6, the control unit 55 sets one of the plurality of switch elements 42e to an off state and sets the remainder to an on state.

With the radio-frequency circuit 100 according to the fifth modification, it is possible to further accurately limit the output power of the amplifier circuit 2 in any of the plurality of communication bands in which the specific transistor Tr2A operates.

In FIG. 4A, each of the number of the resistive elements 41e and the number of the switch elements 42e is two; however, the configuration is not limited thereto. Alternatively, each of the number of the resistive elements 41e and the number of the switch elements 42e may be three or more. In other words, three or more parallel circuits each made up of the resistive element 41e and the switch element 42e may be connected in series.

(3.6) Sixth Modification

In the radio-frequency circuit 100, an attenuation circuit 4f may be applied instead of the attenuation circuit 4e. Hereinafter, the attenuation circuit 4f will be described with reference to FIG. 4B.

Figure 4B:
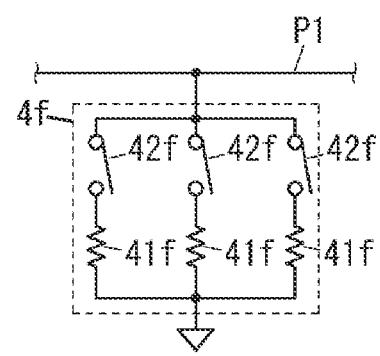
FIG. 4B is a circuit diagram of an attenuation circuit of a radio-frequency circuit according to a sixth modification of the first embodiment.

As shown in FIG. 4B, the attenuation circuit 4f includes a plurality of (three in the illustrated example) resistive elements 41f and a plurality of (three in the illustrated example) switch elements 42f. The plurality of resistive elements 41f and the plurality of switch elements 42f are provided in a one-to-one correspondence with each other. Each of the plurality of resistive elements 41f is connected in series with an associated one of the plurality of switch elements 42f. In other words, the attenuation circuit 4f has a plurality of series circuits each made up of one resistive element 41f and one switch element 42f. Each of the plurality of series circuits is connected between the signal path P1 and the ground.

With the radio-frequency circuit 100 according to the sixth modification, as in the case of the radio-frequency circuit 100 according to the fifth modification, it is possible to further accurately limit the output power of the amplifier circuit 2 in any one of the plurality of communication bands in which the specific transistor Tr2A operates.

In FIG. 4B, each of the number of the resistive elements 41f and the number of the switch elements 42f is three; however, the configuration is not limited thereto. Each of the number of the resistive elements 41f and the number of the switch elements 42f may be two or may be four or more. In other words, the number of series circuits each made up of the resistive element 41e and the switch element 42e may be two or may be four or more.

(3.7) Seventh Modification

In the radio-frequency circuit 100, an attenuation circuit 4g may be applied instead of the attenuation circuit 4e. Hereinafter, the attenuation circuit 4g will be described with reference to FIG. 4C.

Figure 4C:
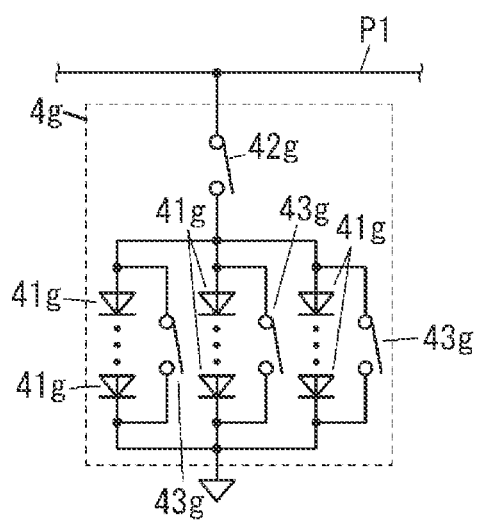
FIG. 4C is a circuit diagram of an attenuation circuit of a radio-frequency circuit according to a seventh modification of the first embodiment.

As shown in FIG. 4C, the attenuation circuit 4g includes a plurality of rectifier elements 41g, a first switch element 42g, and a plurality of (three in the illustrated example) second switch elements 43g. In FIG. 4C, the plurality of rectifier elements 41g is divided into three groups each having a plurality of the rectifier elements 41g. In each group, the plurality of rectifier elements 41g is connected in series with each other. The plurality of groups is connected in parallel with one another. The plurality of second switch elements 43g and the plurality of groups are in a one-to-one correspondence with each other. Each of the plurality of second switch elements 43g is connected in parallel with an associated one of the plurality of groups. The first switch element 42g is connected in series with the plurality of groups connected in parallel with one another. As shown in FIG. 4C, the attenuation circuit 4g according to the seventh modification is connected between the signal path P1 and the ground.

With the radio-frequency circuit 100 according to the seventh modification, as in the case of the radio-frequency circuit 100 according to the fifth modification, it is possible to further accurately limit the output power of the amplifier circuit 2 in any of the plurality of communication bands in which the specific transistor Tr2A operates.

In FIG. 4C, the number of the second switch elements 43g is three; however, the configuration is not limited thereto. The number of the second switch elements 43g may be, for example, two or may be four or more. The plurality of rectifier elements 41g that make up each group is connected in series. Alternatively, the plurality of rectifier elements 41g may be connected in parallel or may be in a combination of series and parallel connections. Furthermore, the number of the rectifier elements 41g that make up each group may be one.

(3.8) Eighth Modification

A radio-frequency circuit 100 according to an eighth modification has the same circuit configuration as the radio-frequency circuit 100 according to the first embodiment, so the description will be made with reference to FIGS. 1 and 2.

In the radio-frequency circuit 100 according to the eighth modification, the control unit 55 acquires information related to the rated power supply voltage of the power supply voltage Vcc applied to the power supply terminal 11 and changes the threshold voltage Vref in accordance with the information. The control unit 55 acquires information related to the rated power supply voltage of the power supply voltage Vcc from, for example, the signal processing circuit 301.

In the radio-frequency circuit 100 according to the eighth modification, the control unit 55, for example, increases the threshold voltage Vref as the rated power supply voltage increases in accordance with information on the acquired rated power supply voltage.

In the radio-frequency circuit 100 according to the eighth modification, when, for example, the specifications of the rated power supply voltage of the power supply voltage Vcc applied to the power supply terminal 11 are changed, the threshold voltage Vref can be changed in accordance with the rated power supply voltage.

(3.9) Other Modifications

For example, in the radio-frequency circuit 100, the number of stages of the transistors Tr2 connected in the amplifier circuit 2 is two; however, the configuration is not limited thereto. The number of stages of the transistors Tr2 connected may be three or more. The amplifier circuit 2 is not limited to a configuration having a plurality of transistors Tr2 and may be the one having at least one transistor Tr2. In short, in the radio-frequency circuit 100, the number of transistors Tr2 may be one. In this case, each of the number of the emitter followers 30 and the number of the bipolar transistors Tr3 in the bias circuit 3 may be one. In the radio-frequency circuit 100, the first-stage transistor Tr21 is set as the specific transistor Tr2A; however, the configuration is not limited thereto. The final-stage transistor Tr22 may be set as the specific transistor Tr2A or each of the first-stage transistor Tr21 and the final-stage transistor Tr22 may be set as the specific transistor When the number of stages of the transistors Tr2 connected is three or more, the transistor Tr2 other than both the first-stage transistor Tr21 and the final-stage transistor Tr22 may be set as the specific transistor Tr2A.

The transistors Tr2 in the amplifier circuit 2 are not limited to bipolar transistors and may be field effect transistors (FETs). When the transistors Tr2 are FETs, the gate, the drain, and the source are respectively an input terminal, an output terminal, and a common terminal.

In the radio-frequency circuit 100, for example, the first switch 102, the filter 103, and the second switch 104 are not indispensable component elements and are additional component elements.

In the radio-frequency circuit 100, the filter 103 is an acoustic wave filter that uses surface acoustic waves; however, the configuration is not limited thereto. The filter 103 may be, for example, an acoustic wave filter that uses boundary acoustic waves, plate waves, or the like.

In the acoustic wave filter, each of the plurality of series arm resonators and the plurality of parallel arm resonators is not limited to an SAW resonator and may be, for example, a bulk acoustic wave (BAW) resonator.

The radio-frequency circuit 100 may include a receiving circuit including a low-noise amplifier that amplifies a reception signal input from the antenna terminal 105 and a filter connected to the low-noise amplifier.

The filter 103 is not limited to a transmission filter and may be a duplexer.

In the radio-frequency circuit 100, the first switch 102 and the second switch 104 each may be, for example, a switch IC that supports general purpose input/output (GPIO).

A voltage input to the first input terminal of the comparator CP1 is not limited to the power supply voltage Vcc and may be, for example, a voltage into which the power supply voltage Vcc is divided by two resistances. In this case, the threshold voltage Vref input to the second input terminal of the comparator CP1 can be suppressed to a lower voltage.

Second Embodiment

Figure 5:
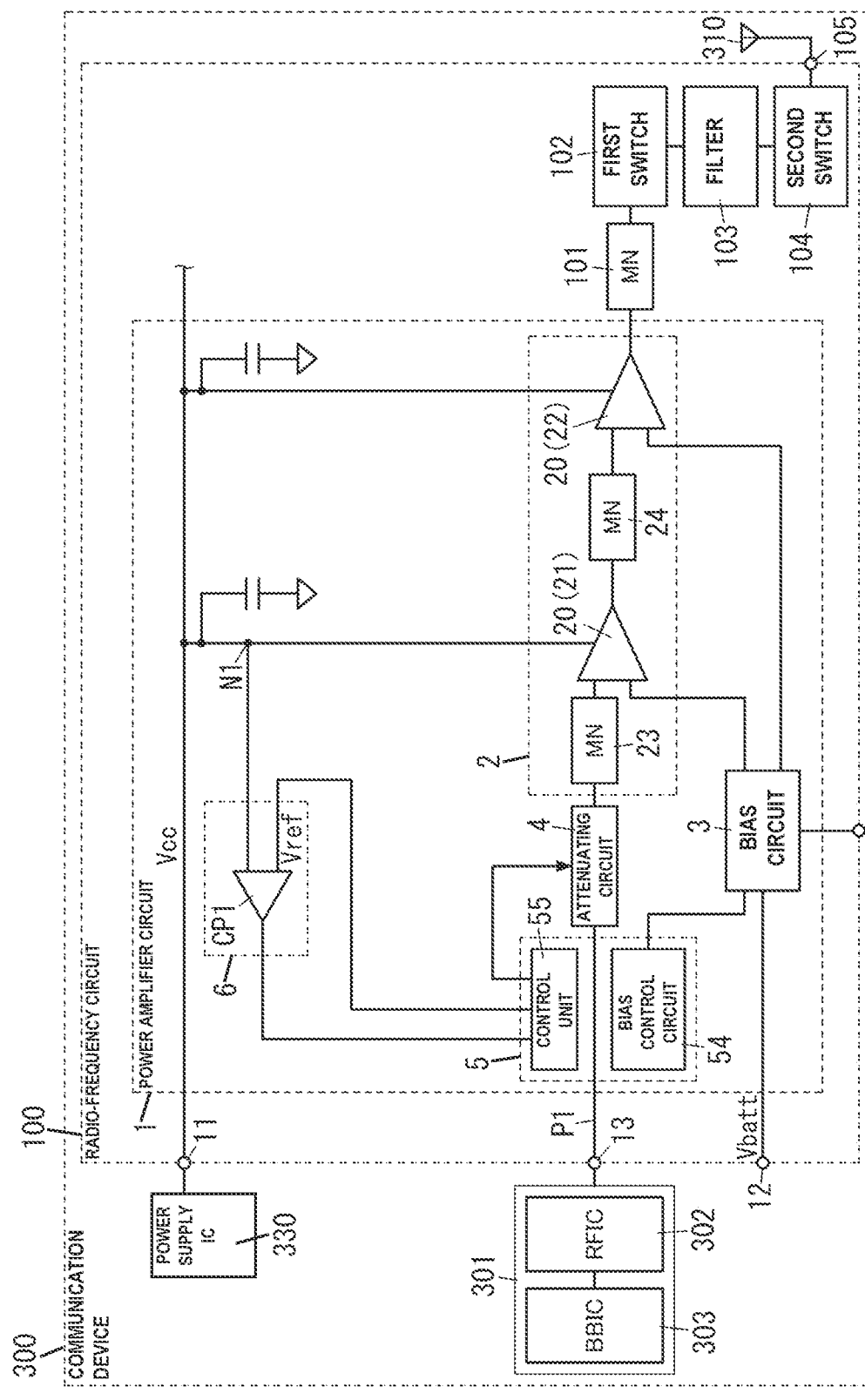
FIG. 5 is a circuit diagram of a radio-frequency circuit and a communication device according to a second embodiment.

A radio-frequency circuit 100 according to a second embodiment will be described with reference to FIG. 5. Regarding the radio-frequency circuit 100 according to the second embodiment, like reference signs denote component elements similar to those of the radio-frequency circuit 100 according to the first embodiment, and the description is omitted.

The radio-frequency circuit 100 according to the second embodiment differs from the radio-frequency circuit 100 according to the first embodiment in that the attenuation circuit 4 is provided on the input side of the first-stage amplifier 21. In other words, in the radio-frequency circuit 100 according to the second embodiment, the attenuation circuit 4 is connected in the signal path P1 between the signal input terminal 13 and the matching circuit 23 connected to the input terminal of the first-stage amplifier 21, as shown in FIG. 5.

In the radio-frequency circuit 100 according to the second embodiment, the attenuation circuit 4 is provided on the input side of the first-stage amplifier 21, so the input power input to the first-stage amplifier 21 can be limited, with the result that the degradation of the first-stage amplifier 21 can be suppressed. In the radio-frequency circuit 100 according to the second embodiment, as in the case of the radio-frequency circuit 100 according to the first embodiment, the output power of the amplifier circuit 2 is further accurately limited.

The attenuation circuit 4 may be connected between the matching circuit 23 and the first-stage amplifier 21.

In the second embodiment as well, any one of the attenuation circuits 4a to 4g may be applied instead of the attenuation circuit 4.

Third Embodiment

Figure 6:
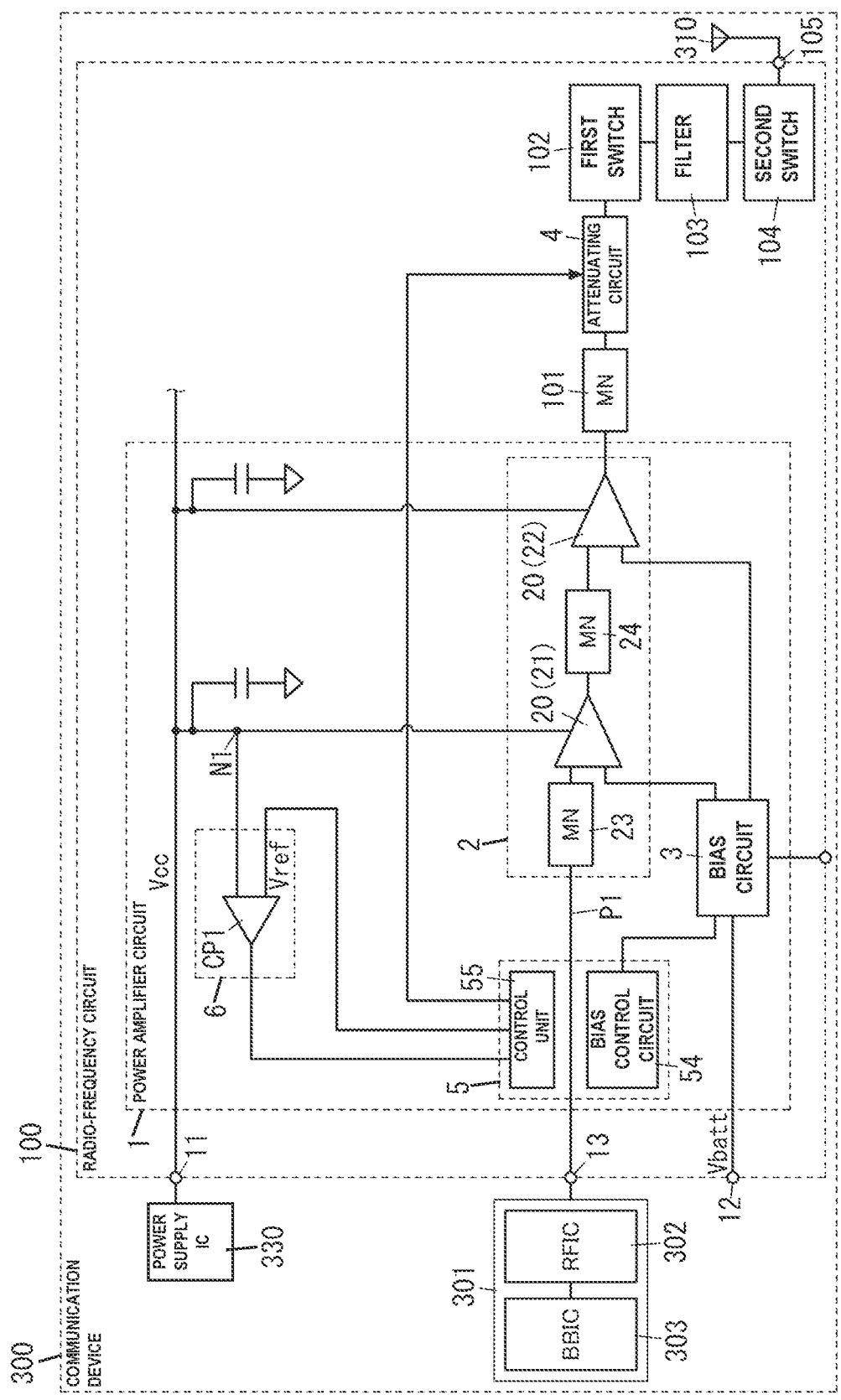
FIG. 6 is a circuit diagram of a radio-frequency circuit and a communication device according to a third embodiment.

A radio-frequency circuit 100 according to a third embodiment will be described with reference to FIG. 6. Regarding the radio-frequency circuit 100 according to the third embodiment, like reference signs denote component elements similar to those of the radio-frequency circuit 100 according to the first embodiment, and the description is omitted.

The radio-frequency circuit 100 according to the third embodiment differs from the radio-frequency circuit 100 according to the first embodiment in that the attenuation circuit 4 is provided on the output side of the final-stage amplifier 22. In other words, in the radio-frequency circuit 100 according to the third embodiment, the attenuation circuit 4 is connected in the signal path P1 between the first switch 102 and the output matching circuit 101 connected to the output terminal of the final-stage amplifier 22, as shown in FIG. 6.

In the radio-frequency circuit 100 according to the third embodiment, the attenuation circuit 4 is provided on the output side of the final-stage amplifier 22, so the input power input to the first switch 102 can be limited, with the result that the degradation of the first switch 102 can be suppressed. In the radio-frequency circuit 100 according to the third embodiment, as in the case of the radio-frequency circuit 100 according to the first embodiment, the output power of the amplifier circuit 2 can be further accurately limited.

The attenuation circuit 4 may be connected between the final-stage amplifier 22 and the output matching circuit 101 or may be connected between the first switch 102 and the filter 103.

In the third embodiment as well, any one of the attenuation circuits 4a to 4g may be applied instead of the attenuation circuit 4.

Fourth Embodiment

Figure 7:
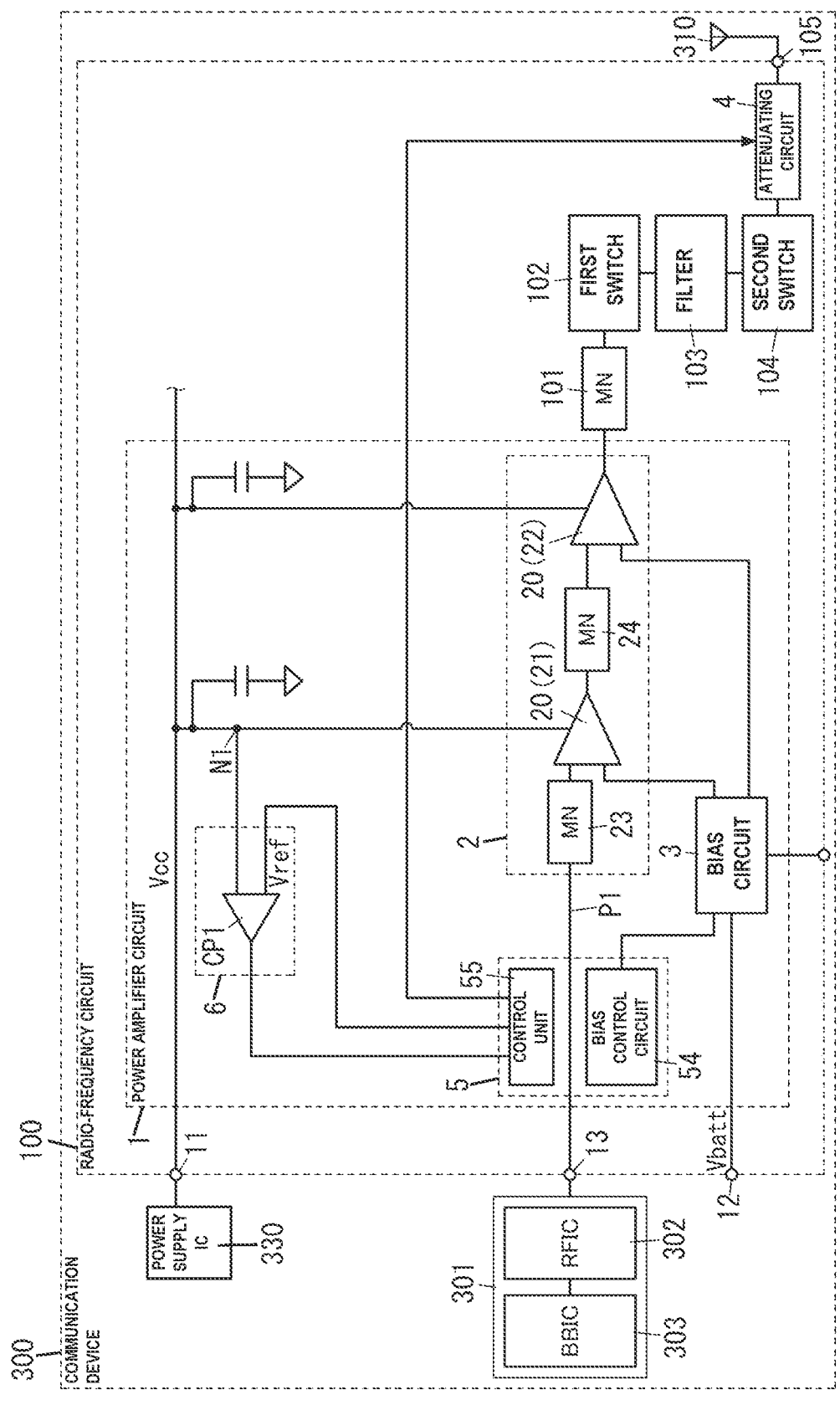
FIG. 7 is a circuit diagram of a radio-frequency circuit and a communication device according to a fourth embodiment.

A radio-frequency circuit 100 according to a fourth embodiment will be described with reference to FIG. 7. Regarding the radio-frequency circuit 100 according to the fourth embodiment, like reference signs denote component elements similar to those of the radio-frequency circuit 100 according to the first embodiment, and the description is omitted.

The radio-frequency circuit 100 according to the fourth embodiment differs from the radio-frequency circuit 100 according to the first embodiment in that the attenuation circuit 4 is connected to the antenna terminal 105. In other words, in the radio-frequency circuit 100 according to the fourth embodiment, the attenuation circuit 4 is connected in the signal path P1 between the second switch 104 and the antenna terminal 105, as shown in FIG. 7.

In the radio-frequency circuit 100 according to the fourth embodiment, the attenuation circuit 4 is provided between the second switch 104 and the antenna terminal 105, so the influence of the antenna 310 in the event of fluctuations in load is reduced. In the radio-frequency circuit 100 according to the fourth embodiment, as in the case of the radio-frequency circuit 100 according to the first embodiment, the output power of the amplifier circuit 2 can be further accurately limited.

In the fourth embodiment as well, any one of the attenuation circuits 4a to 4g may be applied instead of the attenuation circuit 4.

Aspects

The following aspects are disclosed in the specification.

A radio-frequency circuit (100) according to a first aspect includes an amplifier circuit (2), a bias circuit (3), a bias control circuit (54), a comparing section (6), a signal input terminal (13), an antenna terminal (105), an attenuation circuit (4; 4a to 4g), and a control unit (55). The amplifier circuit (2) includes a specific transistor (Tr2A). The specific transistor (Tr2A) has an input terminal and an output terminal. The specific transistor (Tr2A) amplifies a radio-frequency signal input to the input terminal and outputs the radio-frequency signal from the output terminal. The bias circuit (3) supplies a bias current or a bias voltage to the input terminal of the specific transistor (Tr2A). The bias control circuit (54) supplies a control current (Icont) or a control voltage to the bias circuit (3). The comparing section (6) compares a threshold voltage (Vref) with a power supply voltage (Vcc) of a power supply terminal (11) connected to the output terminal of the specific transistor (Tr2A). The signal input terminal (13) is connected to the input terminal of the specific transistor (Tr2A), and a radio-frequency signal is input to the signal input terminal (13). The attenuation circuit (4; 4a to 4g) is connected in a signal path (P1) between the signal input terminal (13) and the antenna terminal (105) and is capable of attenuating a radio-frequency signal. The control unit (55) changes an attenuation of the attenuation circuit (4; 4a to 4g) in accordance with a compared result of the comparing section (6).

According to this aspect, the output power of the amplifier circuit (2) is further accurately limited.

In the radio-frequency circuit (100) according to a second aspect, in the first aspect, the amplifier circuit (2) has a first-stage transistor (Tr21) serving as the specific transistor (Tr2A), and a final-stage transistor (Tr22). The final-stage transistor (Tr22) is connected at a subsequent stage to the first-stage transistor (Tr21). The attenuation circuit (4; 4a to 4g) is connected in the signal path (P1) between the first-stage transistor (Tr21) and the final-stage transistor (Tr22).

According to this aspect, the output power of the amplifier circuit (2) is further accurately limited.

In the radio-frequency circuit (100) according to a third aspect, in the first aspect, the attenuation circuit (4; 4a to 4g) is connected in the signal path (P1) between the signal input terminal (13) and the specific transistor (Tr2A).

According to this aspect, the output power of the amplifier circuit (2) is further accurately limited.

The radio-frequency circuit (100) according to a fourth aspect, in the first aspect, further includes a switch (102). The switch (102) is connected between the specific transistor (Tr2A) and the antenna terminal (105). The attenuation circuit (4; 4a to 4g) is connected in the signal path (P1) between the specific transistor (Tr2A) and the switch (102).

According to this aspect, the output power of the amplifier circuit (2) is further accurately limited.

The radio-frequency circuit (100) according to a fifth aspect, in the first aspect, further includes a switch (104). The switch (104) is connected to the antenna terminal (105).

The attenuation circuit (4; 4a to 4g) is connected in the signal path (P1) between the switch (104) and the antenna terminal (105).

According to this aspect, the output power of the amplifier circuit (2) is further accurately limited.

In the radio-frequency circuit (100) according to a sixth aspect, in any one of the first to fifth aspects, the attenuation circuit (4) includes a switch element (42) and at least one resistive element (41). The switch element (42) is turned on or off in accordance with a compared result of the comparing section (6). The at least one resistive element (41) is connected in parallel with the switch element (42). The at least one resistive element (41) is connected in series with the signal path (P1).

According to this aspect, the small-sized attenuation circuit (4) is implemented with a simple configuration.

In the radio-frequency circuit (100) according to a seventh aspect, in any one of the first to fifth aspects, the attenuation circuit (4a) includes a switch element (42a) and at least one resistive element (41a). The switch element (42a) is turned on or off in accordance with a compared result of the comparing section (6). The at least one resistive element (41a) is connected in series with the switch element (42a). The attenuation circuit (4a) is connected between the signal path (P1) and a ground.

According to this aspect, the small-sized attenuation circuit (4a) is implemented with a simple configuration.

In the radio-frequency circuit (100) according to an eighth aspect, in any one of the first to fifth aspects, the attenuation circuit (4b) includes a switch element (42b) and at least one rectifier element (41b). The switch element (42b) is turned on or off in accordance with a compared result of the comparing section (6). The at least one rectifier element (41b) is connected in series with the switch element (42b). The attenuation circuit (4b) is connected between the signal path (P1) and a ground.

According to this aspect, the small-sized attenuation circuit (4b) is implemented with a simple configuration.

In the radio-frequency circuit (100) according to a ninth aspect, in any one of the first to fifth aspects, the attenuation circuit (4c) includes a switch element (42c) and a T-shape circuit (41c). The switch element (42c) is connected in series with the signal path (P1) and is turned on or off in accordance with a compared result of the comparing section (6). The T-shape circuit (41c) is connected in parallel with the switch element (42c). The T-shape circuit (41c) has two first resistive elements (411, 412) and a second resistive element (413). The two resistive elements (411, 412) are connected in parallel with the switch element (42c). The second resistive element (413) is connected between a ground and a junction point between the two first resistive elements (411, 412).

According to this aspect, variations in RF characteristics are suppressed.

In the radio-frequency circuit (100) according to a tenth aspect, in any one of the first to ninth aspects, the specific transistor (Tr2A) is capable of operating in each of a plurality of communication bands different from each other. The control unit (55) changes the attenuation of the attenuation circuit (4e; 4f; 4g) in accordance with, of the plurality of communication bands, the communication band in which the specific transistor (Tr2A) operates.

According to this aspect, the output power of the amplifier circuit (2) can be further accurately limited in accordance with the communication band in which the specific transistor (Tr2A) operates.

In the radio-frequency circuit (100) according to an eleventh aspect, in any one of the first to ninth aspects, the control unit (55) acquires information related to a rated power supply voltage of the power supply voltage (Vcc) applied to the power supply terminal (11) and changes the threshold voltage (Vref) in accordance with the information.

According to this aspect, when, for example, the specifications of the rated power supply voltage of the power supply voltage (Vcc) applied to the power supply terminal (11) are changed, the threshold voltage (Vref) can be changed in accordance with the rated power supply voltage.

In the radio-frequency circuit (100) according to a twelfth aspect, in any one of the first to eleventh aspects, the comparing section (6) includes a comparator (CP1) that compares the threshold voltage (Vref) with the power supply voltage (Vcc) of the power supply terminal (11). The control unit (55) changes the attenuation of the attenuation circuit (4; 4a to 4g) in accordance with an output of the comparator (CP1).

According to this aspect, in comparison with the case where the power supply voltage (Vcc) of the power supply terminal (11) is divided in accordance with resistances by a resistance voltage circuit and is compared with the threshold voltage, a voltage drop between the power supply terminal (11) and the output terminal of the specific transistor (Tr2A) is reduced, so a decrease in the output power of the amplifier circuit (2) and a decrease in operation efficiency can be suppressed.

A communication device (300) according to a thirteenth aspect includes the radio-frequency circuit (100) that is any one of the first to twelfth aspects, and a signal processing circuit (301). The signal processing circuit (301) is connected to the radio-frequency circuit (100).

According to this aspect, the output power of the amplifier circuit (2) is further accurately limited.

REFERENCE SIGNS LIST 1 power amplifier circuit
2 amplifier circuit
3 bias circuit
4, 4a to 4g attenuation circuit
5 control circuit
6 comparing section
11 power supply terminal
12 battery terminal
13 signal input terminal
20 amplifier
21 first-stage amplifier (specific transistor, first-stage transistor)
22 final-stage amplifier (final-stage transistor)
23, 24, 25 matching circuit
27 input terminal
28 output terminal
30 emitter follower
31 first emitter follower
32 second emitter follower
41, 41a, 41e, 41f resistive element
41b, 41g rectifier element
41c T-shape circuit
41d π-shape circuit
42, 42a to 42g, 43g switch element
52 current source
54 bias control circuit
55 control unit
100 radio-frequency circuit
101 output matching circuit 102 first switch (switch)
103 filter
104 second switch (switch)
105 antenna terminal
300 communication device
301 signal processing circuit
302 RF signal processing circuit
303 baseband signal processing circuit
310 antenna
330 power management IC
411, 412, 414 first resistive element
413, 415, 416 second resistive element
CP1 comparator
D311, D312, D321, D322 diode
Ice current
Icont control current
N1 node
P1 signal path
R31, R32 resistance
Tr2 transistor
Tr21 first-stage transistor
Tr22 final-stage transistor
Tr3 bipolar transistor
Tr31 first bipolar transistor
Tr32 second bipolar transistor
Vcc power supply voltage
Vref threshold voltage

The invention claimed is:

1. A radio-frequency circuit comprising:
an amplifier circuit comprising a specific transistor that has an input terminal and an output terminal, and that is configured to amplify a radio-frequency signal input to the input terminal and to output an amplified radio-frequency signal from the output terminal;
a bias circuit configured to supply a bias current or a bias voltage to the input terminal of the specific transistor;
a bias control circuit configured to supply a control current or a control voltage to the bias circuit;
comparing circuitry configured to compare a threshold voltage with a power supply voltage of a power supply terminal connected to the output terminal of the specific transistor;
a signal input terminal connected to the input terminal of the specific transistor, and to which the radio-frequency signal is input;
an antenna terminal;
an attenuation circuit connected in a signal path between the signal input terminal and the antenna terminal, and configured to attenuate the radio-frequency signal; and
control circuitry configured to change an attenuation of the attenuation circuit in accordance with a result of the comparing section.

2. The radio-frequency circuit according to claim 1, wherein the amplifier circuit comprises:
the specific transistor, the specific transistor being a first-stage transistor of the amplifier circuit, and
a final-stage transistor connected at a stage subsequent to the first-stage transistor, and
wherein the attenuation circuit is connected in the signal path between the first-stage transistor and the final-stage transistor.

3. The radio-frequency circuit according to claim 1, wherein the attenuation circuit is connected in the signal path between the signal input terminal and the specific transistor.

4. The radio-frequency circuit according to claim 1, further comprising a switch connected between the specific transistor and the antenna terminal,
wherein the attenuation circuit is connected in the signal path between the specific transistor and the switch.

5. The radio-frequency circuit according to claim 1, further comprising a switch connected to the antenna terminal,
wherein the attenuation circuit is connected in the signal path between the switch and the antenna terminal.

6. The radio-frequency circuit according to claim 1, wherein the attenuation circuit comprises:
a switch that is configured to turn on or off in accordance with the result of the comparing circuitry, and
at least one resistive circuit element connected in parallel with the switch, and
wherein the at least one resistive circuit element is connected in series with the signal path.

7. The radio-frequency circuit according to claim 1, wherein the attenuation circuit comprises:
a switch that is configured to turn on or off in accordance with the result of the comparing circuitry, and
at least one resistive circuit element connected in series with the switch, and
wherein the attenuation circuit is connected between the signal path and ground.

8. The radio-frequency circuit according to claim 1, wherein the attenuation circuit comprises:
a switch that is configured to turn on or off in accordance with the result of the comparing circuitry, and
at least one rectifier circuit element connected in series with the switch, and
wherein the attenuation circuit is connected between the signal path and ground.

9. The radio-frequency circuit according to claim 1, wherein the attenuation circuit comprises:
a switch that is connected in series with the signal path, and that is configured to turn on or off in accordance with the result of the comparing circuitry, and
a T-shape circuit connected in parallel with the switch, and
wherein the T-shape circuit comprises:
two first resistive circuit elements connected in parallel with the switch, and
a second resistive circuit element connected between ground and a node between the two first resistive circuit elements.

10. The radio-frequency circuit according to claim 1, wherein the specific transistor is configured to operate in each of a plurality of communication bands different from each other, and the control circuitry is configured to change the attenuation of the attenuation circuit in accordance with the communication band of the plurality of communication bands in which the specific transistor operates.

11. The radio-frequency circuit according to claim 1, wherein the control circuitry is configured to acquire information related to a rated power supply voltage of the power supply voltage applied to the power supply terminal, and to change the threshold voltage in accordance with the information.

12. The radio-frequency circuit according to claim 1, wherein the comparing circuitry comprises a comparator configured to compare the power supply voltage of the power supply terminal with the threshold voltage, and
wherein the control circuitry is configured to change the attenuation of the attenuation circuit in accordance with an output of the comparator.

13. A communication device comprising:
the radio-frequency circuit according to claim 1; and
a signal processing circuit connected to the radio-frequency circuit.

* * * * *